United States Patent
Lee et al.

(10) Patent No.: US 7,185,764 B2
(45) Date of Patent: Mar. 6, 2007

(54) WAFER SHIPPING DEVICE AND STORAGE METHOD FOR PREVENTING FLUORIDATION IN BONDING PADS

(75) Inventors: Hung-Wen Lee, Hsin-Chu (TW); Ching-Ping Wu, Hsin-Chu (TW); Yen-Huei Su, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 227 days.

(21) Appl. No.: 10/600,539

(22) Filed: Jun. 23, 2003

(65) Prior Publication Data

US 2004/0000495 A1 Jan. 1, 2004

(30) Foreign Application Priority Data

Jun. 24, 2002 (TW) .............................. 91113771 A

(51) Int. Cl.
*B65D 85/30* (2006.01)
(52) U.S. Cl. .................................... 206/710; 206/213.1
(58) Field of Classification Search ............. 206/213.1, 206/710, 711, 712
See application file for complete search history.

(56) References Cited

U.S. PATENT DOCUMENTS

| | | | | |
|---|---|---|---|---|
| 4,248,346 A | * | 2/1981 | Johnson ...................... 206/711 |
| 5,944,193 A | * | 8/1999 | Shimizu ...................... 206/710 |
| 6,003,674 A | * | 12/1999 | Brooks ........................ 206/711 |
| 6,269,945 B1 | * | 8/2001 | Colombo .................. 206/213.1 |
| 6,467,626 B1 | * | 10/2002 | Misaka ........................ 206/710 |
| 6,533,000 B2 | * | 3/2003 | Saga ............................ 141/98 |
| 6,685,012 B2 | * | 2/2004 | Bowden et al. ........... 206/213.1 |
| 6,770,109 B2 | * | 8/2004 | Tanaka et al. ............. 55/385.6 |

\* cited by examiner

*Primary Examiner*—John A. Ricci
(74) *Attorney, Agent, or Firm*—Birch, Stewart, Kolasch and Birch, LLP

(57) ABSTRACT

A wafer-shipping device and a wafer storage method for protecting bonding pads from fluoridation. First, at least one through hole is drilled in the shipping box. The wafer is then placed in the shipping box. A packaging bag containing the shipping box is put into a vacuum packaging machine to remove air from the packaging bag and the shipping box. A dry inert gas is then introduced into the packaging bag and the shipping box until approaching atmospheric pressure as so to prevent the shipping box from collapse. The packaging bag is then sealed.

9 Claims, 2 Drawing Sheets

WAFER SHIPPING DEVICE AND STORAGE METHOD FOR PREVENTING FLUORIDATION IN BONDING PADS

BACKGROUND OF THE INVENTION

1. Field of the Invention

This invention relates to a wafer-shipping device and a wafer storage method for protecting bonding pads from fluoridation. In particular, the present invention relates to a wafer-shipping device and a wafer storage method in which a passivation film is formed and etched.

2. Description of the Related Art

After processing, wafers are placed in a shipping box by vacuum sealing to ensure that wafers are not contaminated by particles and moisture during shipping. Traditionally, after the wafer is placed in the shipping box, the shipping box is sealed. Then, the shipping box is wrapped with a packaging bag, and a vacuum removes air and moisture from the packaging bag.

However, after recieveing the wafer, the shipping box is airtight. Consequently, as shown in FIG. 1, flouride (F) inside the passivation film 32 easily diffuses throughout the whole shipping box, as shown by arrows, and contacts the Al bonding pads 30. Hence, fluoridation occurs on the surface of the Al bonding pads 30, and the wire bonding process cannot be easily performed.

SUMMARY OF THE INVENTION

The object of the present invention is to provide a wafer-shipping device and a wafer storage method for preventing bonding pad fluoridation.

Another object of the present invention is to reduce F content in the shipping box to protect the bonding pads from fluoridation.

According to a first aspect of the invention, the wafer storage method for preventing bonding pad fluoridation comprises the following steps. First, at least one through hole is drilled in the shipping box. The wafer is then placed in the shipping box. A packaging bag containing the shipping box is vacuum sealed until the pressure drops to 350–400 mmHg. A dry inert gas is then introduced into the packaging bag and the shipping box until approaching atmospheric pressure so as to prevent the shipping box from collapse. The packaging bag is then sealed.

According to a second aspect of the invention, a wafer-shipping device comprises a shipping box, a wafer placed in the shipping box, a packaging bag to contain the shipping box, and a dry inert gas filling the packaging bag and the shipping box. Thus, the wafer is surrounded with the dry inert gas.

The above-mentioned shipping box has at least one through hole so that the space inside the shipping box and the space between the shipping box and packaging bag are connected. Further, the above-mentioned dry inert gas can be nitrogen, which is used to replace the impurities in the shipping box.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only and thus are not limitative of the present invention.

DETAILED DESCRIPTION OF THE INVENTION

A Wafer-Shipping Device

Figure 1:
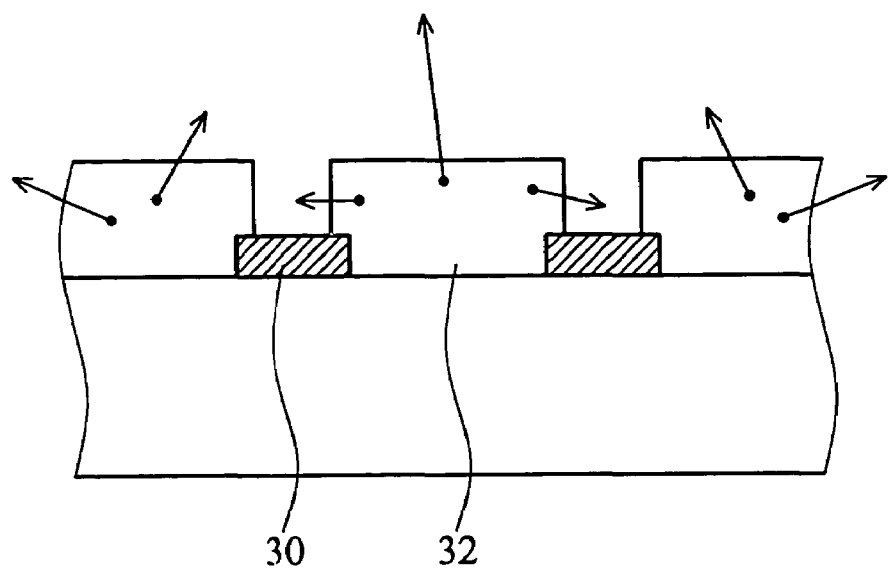
FIG. 1 depicts F in the passivation film diffusing out and contacts Al bonding pads after the wafer is placed in the shipping box.
Figure 2:
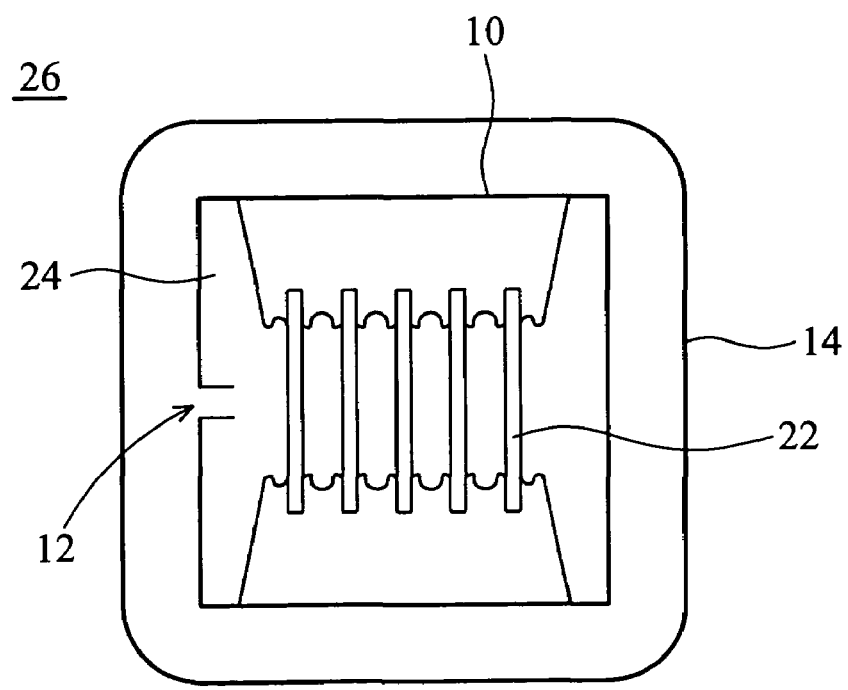
FIG. 2 shows a shipping device according to the present invention.

FIG. 2 is a cross section of a wafer-shipping device according to the present invention. The wafer-shipping device facilitates storage and shipping of the wafer, on which bonding pads and a passivation layer are formed. The wafer-shipping device comprises a shipping box 10 to contain the wafer 22, a packaging bag 14 for packing the shipping box 10, and a dry inert gas 24 filling the packaging bag 14 and the shipping box 10. The packaging bag 14 isolates the shipping box 10 from the surroundings 26.

Further, the shipping box 10 has at least one through hole 12 so that the inside and outside of the shipping box 10 are connected. Furthermore, the dry inert gas 24 can be nitrogen replacing the impurities inside the shipping box 10.

Wafer Storage Method for Protecting Bonding Pads from Fluoridation

Figure 3:
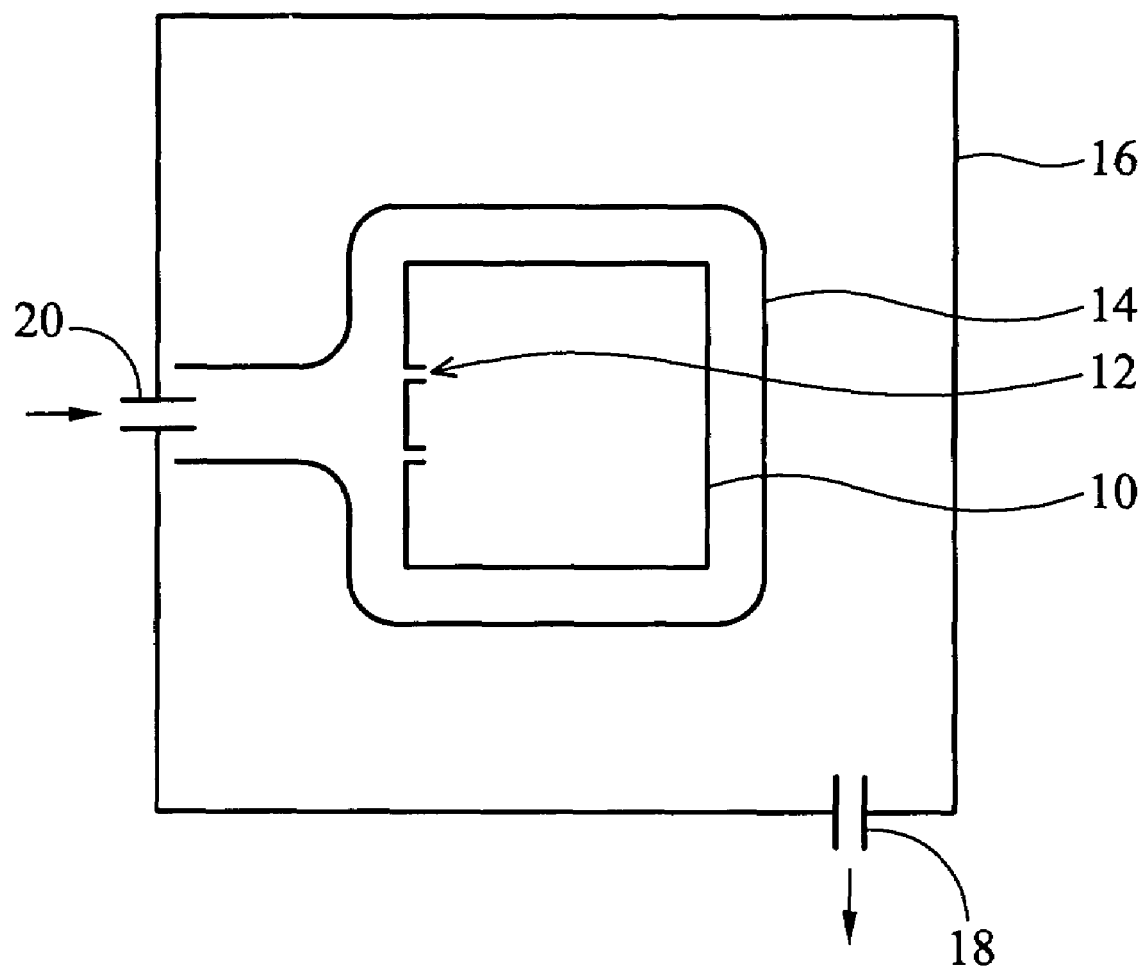
FIG. 3 shows vacuum sealing according to the present invention.

As shown in FIG. 3, at least one through hole 12 is drilled through the shipping box 10, followed by washing and cleaning of the shipping box 10.

The wafer having bonding pads and the passivation layer is placed into the drilled shipping box 10. After puffing the shipping box 10 into the packaging bag 14, the packaging bag 14 is put into the vacuum packaging machine 14 Impurities, such as F (fluorine), are pumped out through an exhaust 18 by the vacuum packaging machine until the pressure is reduced to 350–400 mmHg, as are air and moisture inside the shipping box 10 and between the packaging bag 14 and the shipping box 10.

The dry inert gas, such as nitrogen, is introduced from inlet 20 to balance the pressure inside the shipping box 10 and the atmospheric pressure to prevent the shipping box 10 from deforming. Then, the packaging bag 14 is sealed.

After testing, it is found that the concentration of F in the shipping box is reduced when storing the wafer in the above-mentioned wafer-shipping device. Thus, the bonding pads can be protected from fluoridation.

After the wafer is placed in the above-mentioned wafer storage device by the vacuum sealing, the wafer can be transported to down-stream plants for the next stage package process.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A wafer-shipping device, comprising:
   a shipping box for a wafer, the shipping box having at least one through hole;
   a packaging bag to contain the shipping box; and
   a dry inert gas filling the packaging bag and the shipping box to balance a pressure inside the shipping box and the atmospheric pressure in order to prevent the shipping box from deforming, the dry inert gas surrounding the wafer, wherein the dry inert gas is nitrogen.

2. The wafer-shipping device as claimed in claim 1, wherein the pressure inside the shipping box approximates atmospheric pressure.

3. The wafer-shipping device as claimed in claim 1, wherein after pumping an air out of the shipping box and the packaging bag, the dry inert gas fills the shipping box and the packaging bag.

4. A wafer preserver, comprising:
   a container having at least a vacant space;
   a wrapping for packaging the container; and
   a gas filling the container and surrounding the wafer to balance a pressure inside the container and the atmospheric pressure in order to prevent the container from deforming, wherein the gas is dry nitrogen.

5. The wafer-shipping device as claimed in claim 4, wherein the pressure inside the shipping box approximates atmospheric pressure.

6. The wafer preserver as claimed in claim 4, wherein after pumping an air from the container and the wrapping, the gas fills the container and the wrapping.

7. A semiconductor preserver, comprising:
   a first space for containing the semiconductor;
   a second space formed by a gas-proof material surrounding the first space;
   a vacant space between the first space and the second space; and
   an inert gas filling the first space, the second space and the vacant space to balance a pressure inside the first space and the atmospheric pressure in order to prevent the first space from deforming, wherein the inert gas is dry nitrogen.

8. The semiconductor preserver as claimed in claim 7, wherein the pressure inside the first space approximates atmospheric pressure.

9. The semiconductor preserver as claimed in claim 7, wherein after pumping an air out of the first space, the second space and the vacant space, the inert gas fills the first space, the second space and the vacant space.

* * * * *